United States Patent
Yano

(10) Patent No.: US 8,704,543 B2
(45) Date of Patent: Apr. 22, 2014

(54) TEST HEAD MOVING APPARATUS AND ELECTRONIC COMPONENT TESTING APPARATUS

(75) Inventor: Takayuki Yano, Saitama (JP)

(73) Assignee: Advantest Corporation, Tokyo (JP)

( * ) Notice: Subject to any disclaimer, the term of this patent is extended or adjusted under 35 U.S.C. 154(b) by 507 days.

(21) Appl. No.: 13/003,953

(22) PCT Filed: Jul. 14, 2008

(86) PCT No.: PCT/JP2008/062670
§ 371 (c)(1),
(2), (4) Date: Mar. 7, 2011

(87) PCT Pub. No.: WO2010/007652
PCT Pub. Date: Jan. 21, 2010

(65) Prior Publication Data
US 2011/0156733 A1 Jun. 30, 2011

(51) Int. Cl.
*G01R 31/00* (2006.01)

(52) U.S. Cl.
USPC .............. 324/750.16; 324/750.03; 324/750.1

(58) Field of Classification Search
USPC .............. 324/750.01–750.3, 754.01–754.31, 324/755.01–755.11, 757.01–757.05, 324/762.01; 414/791.2
See application file for complete search history.

(56) References Cited

U.S. PATENT DOCUMENTS

| | | | | |
|---|---|---|---|---|
| 5,506,512 | A * | 4/1996 | Tozawa et al. | 324/750.19 |
| 5,900,737 | A * | 5/1999 | Graham et al. | 324/750.22 |
| 7,151,386 | B2 * | 12/2006 | Kim | 324/754.03 |
| 2001/0038295 | A1 * | 11/2001 | Kim et al. | 324/765 |
| 2002/0024355 | A1 * | 2/2002 | Suzuki et al. | 324/765 |
| 2004/0032248 | A1 | 2/2004 | Gudin | |
| 2006/0177298 | A1 | 8/2006 | Mueller | |
| 2008/0298946 | A1 * | 12/2008 | Shim et al. | 414/749.1 |
| 2009/0033352 | A1 * | 2/2009 | An et al. | 324/765 |
| 2010/0079161 | A1 * | 4/2010 | Endo et al. | 324/761 |
| 2011/0057674 | A1 * | 3/2011 | Weissacher et al. | 324/750.16 |

FOREIGN PATENT DOCUMENTS

| | | |
|---|---|---|
| CN | 1474945 | 2/2004 |
| CN | 1864069 | 11/2006 |
| JP | 3-57940 | 6/1991 |
| JP | 2003-98224 | 4/2003 |
| TW | 2003/01823 | 7/2003 |
| TW | 2005/06374 | 2/2005 |

OTHER PUBLICATIONS

Taiwan Office action, mail date is Oct. 5, 2012.
China Office action, mail date is Apr. 1, 2013.
China Office action, dated Oct. 10, 2012.

* cited by examiner

*Primary Examiner* — Huy Q Phan
*Assistant Examiner* — Adam Clarke
(74) *Attorney, Agent, or Firm* — Greenblum & Bernstein, P.L.C.

(57) ABSTRACT

A test head moving apparatus includes elevating arms that move a test head up and down, a frame that horizontally moves the test head, and an interlock mechanism that prohibits the horizontal movement of the frame on the basis of a height of the test head. The interlock mechanism has a limit switch that detects that the test head is positioned at the lowermost limit and stoppers capable of pressing the pressing units onto a floor plane.

6 Claims, 8 Drawing Sheets

TEST HEAD MOVING APPARATUS AND ELECTRONIC COMPONENT TESTING APPARATUS

TECHNICAL FIELD

The present invention relates to a test head moving apparatus which moves a test head in order to join the test head to a handler in an electronic component testing apparatus for testing electronic components such as semiconductor integrated circuit elements (hereinafter also referred to representatively as IC devises), and to an electronic component testing apparatus comprising the same.

BACKGROUND ART

An electronic component testing apparatus for testing IC devices having been packaged comprises a test head to be electrically connected with IC devices, a tester which communicates testing signals with IC devices via the test head, and a handler (electronic component handling apparatus) which presses IC devices to the test head.

The handler comprises a chamber for subjecting IC devices to a thermal stress of high temperature or low temperature. An opening is formed at the bottom face of the chamber. The upper portion of a test head is inserted into this opening so as to join the test head to the handler.

This joining operation for a test head employs a test head moving apparatus capable of handling the test head. At the time of joining the test head to the handler, initially the test head moving apparatus moves the test head in a horizontal direction so as to locate the test head below the opening of the handler. Then the test head moving apparatus lifts up the test head so as to insert the upper portion of the test head into the opening of the handler.

DISCLOSURE OF THE INVENTION

Problems to be Solved by the Invention

There have been problems including that, when the test head moving apparatus horizontally moves toward the handler in the status of keeping the test head at a high position on the occasion of the above joining, the test head and the handler interfere with each other thereby damaging the test head and/or the handler.

Problems to be solved by the present invention include to provide a test head moving apparatus capable of preventing damages of a test head and/or an electronic component handling apparatus, and to provide an electronic component testing apparatus comprising the same.

Means for Solving the Problems

According to the present invention, there is provided a test head moving apparatus which moves a test head in order to join the test head to an electronic component handling apparatus in an electronic component testing apparatus, the test head moving apparatus comprising: an elevating means that moves the test head up and down; a horizontally moving means that moves the test head in a horizontal direction; and a prohibiting means that prohibits a horizontal movement of the horizontally moving means on the basis of a height of the test head (refer to claim 1).

Although not particularly limited in the above invention, it is preferred that the prohibiting means has: a detecting means that detects that the test head is positioned at a predetermined height; and a stopper that permits or prohibits the horizontal movement of the horizontally moving means when the detecting means detects that the test head is positioned at the predetermined height and that prohibits or permits the horizontal movement of the horizontally moving means when the detecting means fails to detect that the test head is positioned at the predetermined height (refer to claim 2).

Although not particularly limited in the above invention, it is preferred that the predetermined height is a lowermost limit within a range where the elevating means is capable of moving the test head up and down; and the stopper permits the horizontal movement of the horizontally moving means when the detecting means detects that the test head is positioned at the lowermost limit, and the stopper prohibits the horizontal movement of the horizontally moving means when the detecting means fails to detect that the test head is positioned at the lowermost limit (refer to claim 3).

Although not particularly limited in the above invention, it is preferred that the prohibiting means has: an abutting member that abuts against a floor plane; a moving means that moves the abutting member toward or away from the floor plane; and a first biasing means that is positioned between the abutting member and the moving means and biases the abutting member toward the floor plane (refer to claim 4).

Although not particularly limited in the above invention, it is preferred that the moving means has: a rod to which the abutting member is attached via the first biasing means; and a fluid pressure cylinder that moves the rod, and the fluid pressure cylinder is a cylinder having a lock function capable of locking the rod in response to a shutoff of supply of pressurized fluid (refer to claim 5).

Although not particularly limited in the above invention, it is preferred that the fluid pressure cylinder has a second biasing means that biases a piston connected to one end of the rod toward the floor plane.

Also in order to achieve the above object, according to the present invention, there is provided an electronic component testing apparatus for testing an electronic component under test, the electronic component testing apparatus comprising: the above test head moving apparatus; a test head supported by the test head moving apparatus; and a tester electrically connected to the test head (refer to claim 7).

Advantageous Effect of the Invention

According to the present invention, the horizontal movement by the horizontally moving means is prohibited on the basis of the height of the test head. Consequently, it is possible to avoid the interference between the test head and the electronic component handling apparatus thereby to prevent the test head and/or the electronic component handling apparatus from being damaged.

DESCRIPTION OF REFERENCE NUMERALS

10; test head moving apparatus
  11; frame
  15; elevating arm
  20; interlock mechanism
    23; limit switch
    24; switching valve
    30; stopper
      40; air cylinder
        41; piston
        42; spring
        43; rod
        44, 45 ports
      50; pressing unit
        51; base plate
        52; spring
        53; abutting plate
        54; bolt
100; test head
300; handler
  310; opening
BL; backlash

BEST MODES FOR CARRYING OUT THE INVENTION

Hereinafter, embodiments of the present invention will be described in conjunction with drawings.

Figure 1:
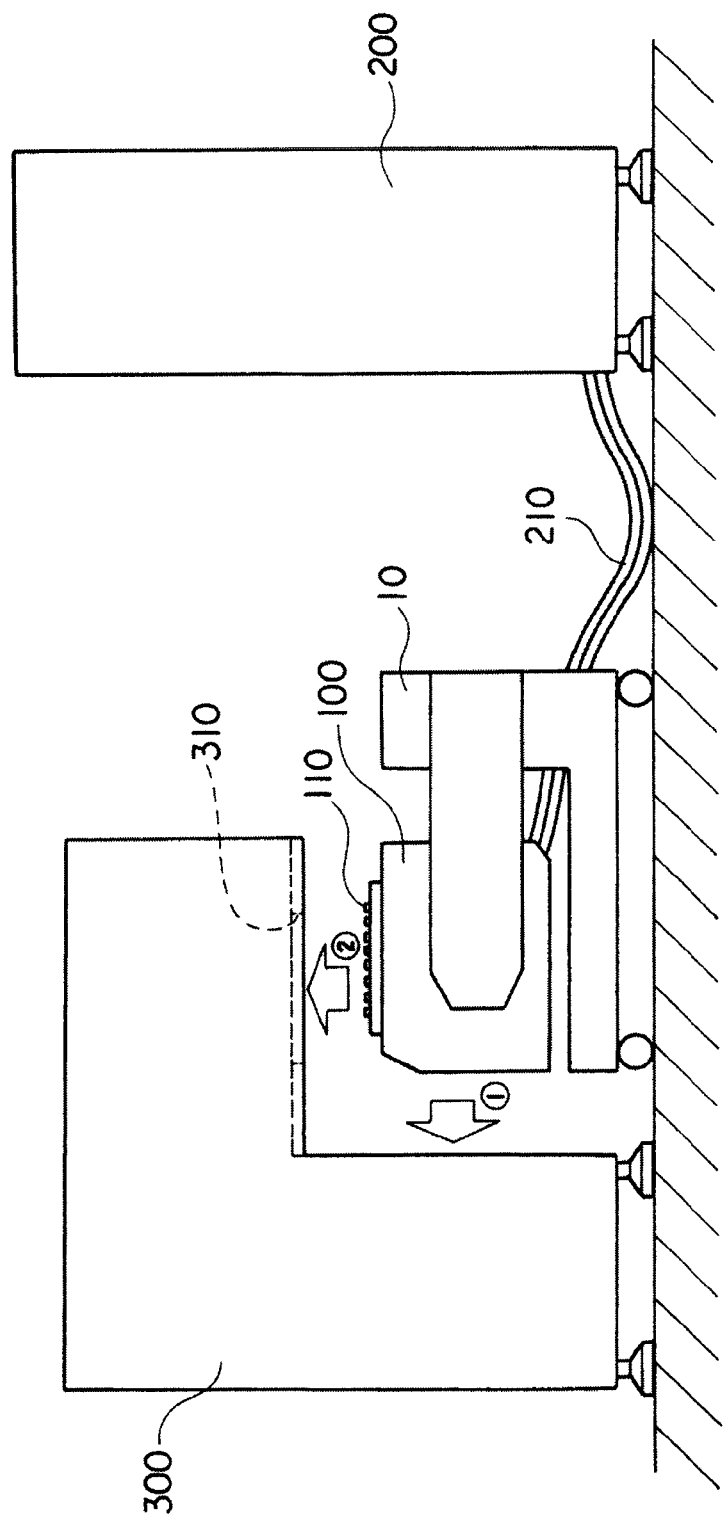
FIG. 1 is a schematic side view illustrating an electronic component testing apparatus according to an embodiment of the present invention.

FIG. 1 is a schematic side view illustrating an electronic component testing apparatus according to the present embodiment.

The electronic component testing apparatus according to the present embodiment comprises, as shown in FIG. 1, a test head 100 to be electrically connected with IC devices, a tester (mainframe) 200 communicating testing signals with IC devices via the test head 100, a handler 300 pressing IC devices to the test head 100, and a test head moving apparatus 10 for joining the test head 100 to the handler 300. The test head 100 and tester 200 are electrically connected with each other via cables 210. The upper portion of test head 100 is mounted thereon with sockets 150 to be electrically contacted with IC devices. The handler 300 has an opening 310 formed thereon so that the upper portion of test head 100 is inserted into a chamber.

As shown in the same figure, the test head 100 is to be joined to the handler 300 using the test head moving apparatus 10. On the occasion of joining the test head 100 to the handler 300, initially the test head moving apparatus 10 moves the test head 100 in a horizontal direction so as to locate the test head 100 below the opening 310 of handler 300. Then the test head moving apparatus 10 lifts up the test head 100 so as to insert the upper portion of test head 100 into the opening 310.

The test head moving apparatus 10 according to the present embodiment will be described hereinafter.

Figure 2:
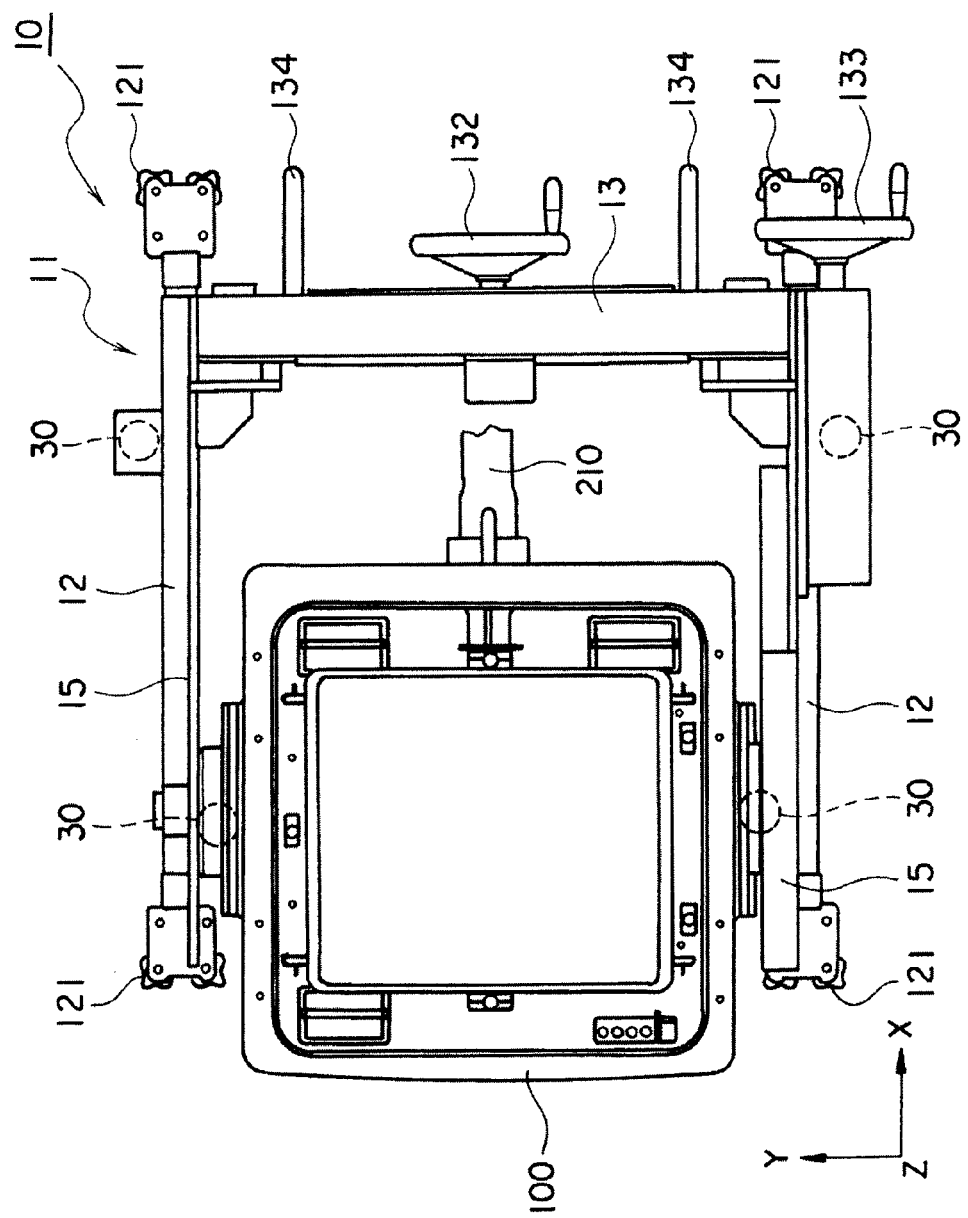
FIG. 2 is a plan view illustrating a test head moving apparatus according to the embodiment of the present invention.
Figure 3:
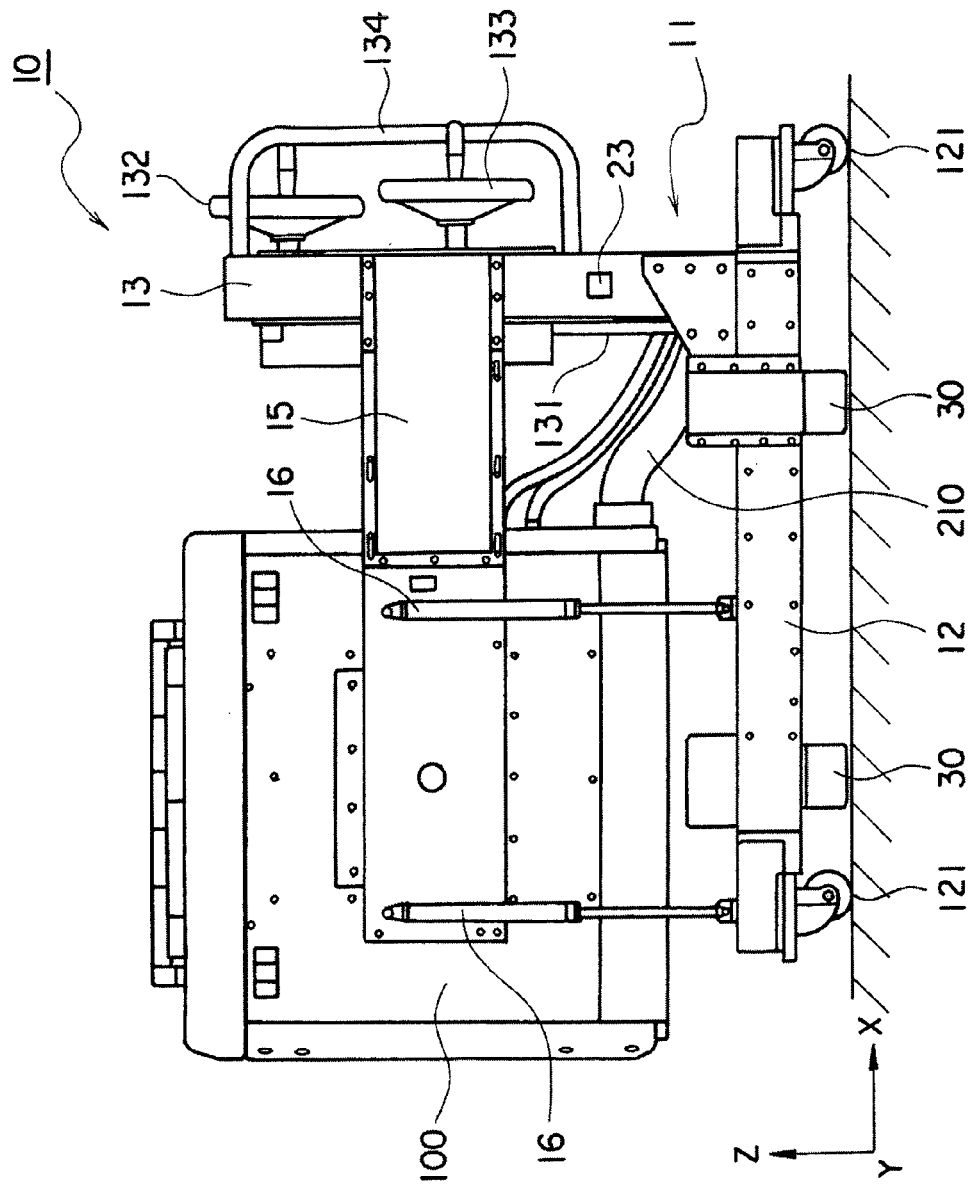
FIG. 3 is a side view illustrating the test head moving apparatus according to the embodiment of the present invention.
Figure 4:
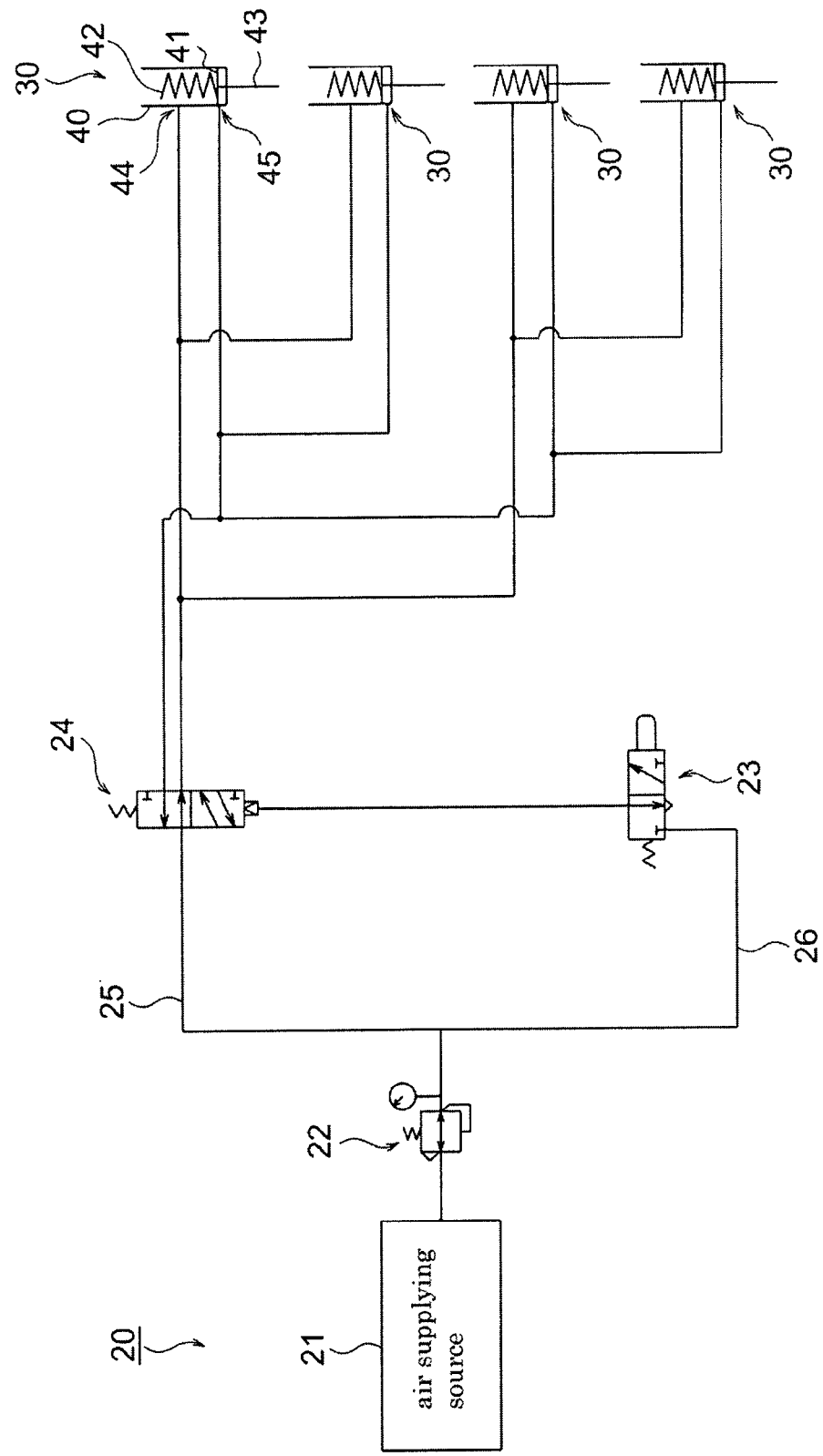
FIG. 4 is an air piping diagram illustrating the entire structure of an interlock mechanism according to the embodiment of the present invention.
Figure 5:
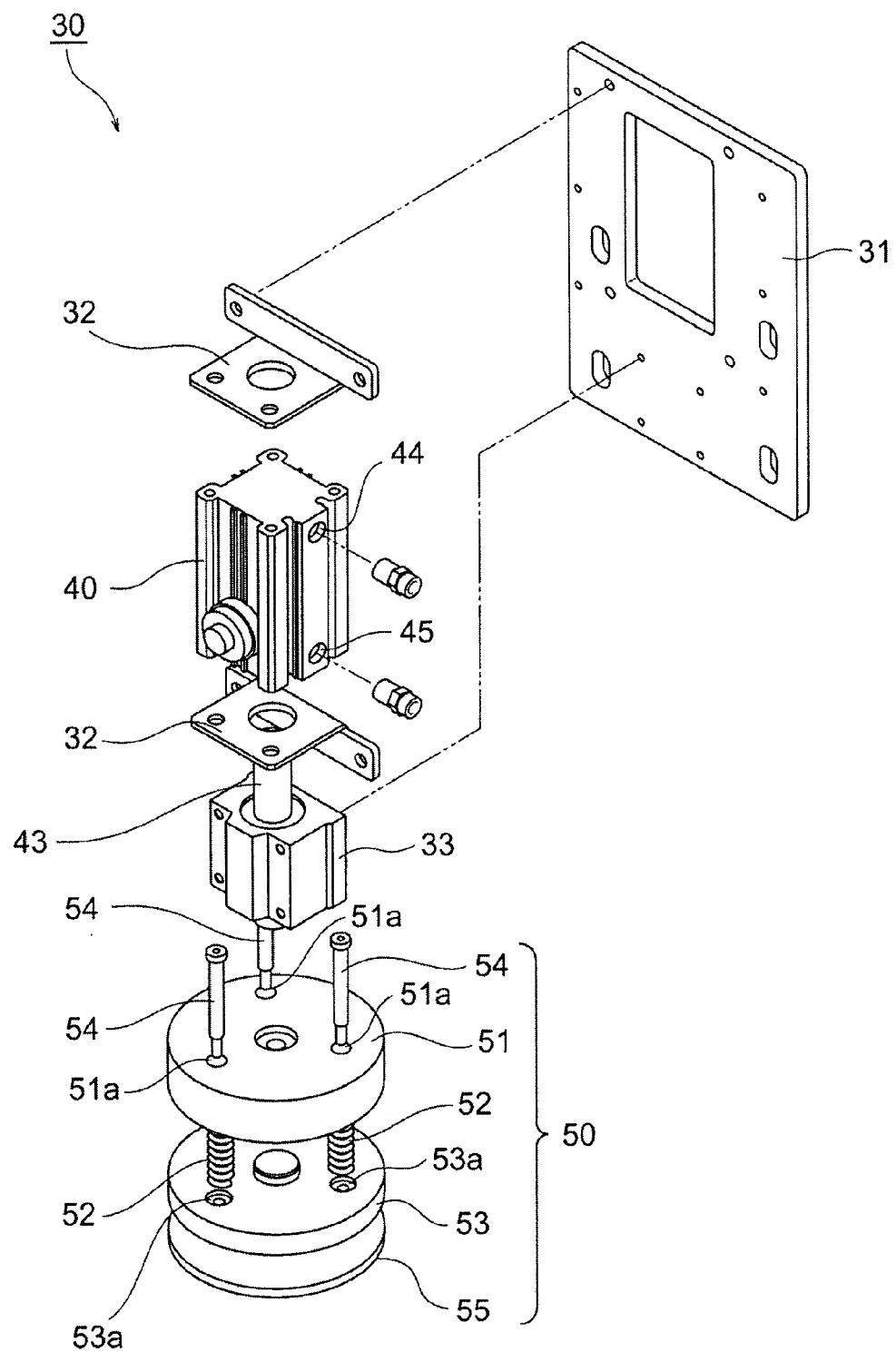
FIG. 5 is an exploded perspective view of a stopper according to the embodiment of the present invention.

FIG. 2 and FIG. 3 are a plan view and a side view illustrating the test head moving apparatus according to the present embodiment, FIG. 4 is an air piping diagram illustrating the entire structure of an interlock mechanism according to the present embodiment, and FIG. 5 is an exploded perspective view of a stopper according to the present embodiment.

The test head moving apparatus 10 according to the present embodiment is, as described above, an apparatus which is capable of moving the test head 100 both in horizontal direction and vertical direction in order to join the test head 100 to the handler 300. As shown in FIG. 2 and FIG. 3, this test head moving apparatus 10 comprises a frame 11 capable of horizontal movement and two elevating arms 15 supported by the frame 11 as being movable up and down.

The frame 11 comprises two base members 12 arranged to be parallel along the X axis direction and an upright member 13 upstanding between the base members 11.

Casters 121 are respectively attached to front and back ends of each base member 12. These casters 121 allow the frame 11 to move horizontally (to move in any direction parallel to the XY plane). Alternatively, instead of the casters 121, linear guides placed on the floor may horizontally move the frame 11.

The upright member 13 is fixed in the vicinity of the back end of each base member 11 by means of bolts and the like. Linear guides 131 are provided on both side of the front surface of the upright member 13 along the Z axis direction and the elevating arms 15 are supported by the linear guides 131 as being movable up and down.

Also two operating handles 132 and 133 are provided on the back surface of upright member 13. An operator can move the elevating arms 15 upwards or downwards via a gear mechanism not particularly shown by rotating the first operating handle 132. On the other hand, the operator can adjust the inclination of the test head 100 via a chain mechanism not particularly shown by rotating the second operating handle 133. Further, two pulls 134 is also provided on the back surface of upright member 13 and the pulls 134 are used when the operator horizontally moves the test head moving apparatus 10.

The two elevating arms 15, which extend in parallel along the X axis direction, are allocated above the base members 12. The test head 100 is located between front ends of these elevating arms 15, and elevating arms 15 and test head 100 are fixed to one another using bolts and the like. On the other hand, back ends of the elevating arms 15 are supported by the linear guides 131 of upright member 13 to be movable up and down. Thus, the test head moving apparatus 10 allows the test head 100 to move upward and downward. Gas springs 16 are provided between the base members 12 and elevating arms 15. The gas springs 16 assist the upward movement operations of elevating arms 15.

The test head moving apparatus 10 according to the present embodiment further comprises an interlock mechanism 20 which prevents interference between the test head 100 and handler 300 at the time of joining operation thereof.

As shown in FIG. 4, this interlock mechanism 20 comprises an air supplying source 21, a regulator 22, a limit switch 23, a switching valve 24, pipes 25 and 26, and four stoppers 30.

The air supplying source 21 is configured of, for example, an air compressor. The regulator 22 is capable of adjusting air pressure supplied from the air supplying source 21. The air supplying source 21 is connected to a main pipe 25 for driving the stoppers 30 and to a sub pipe 26 for controlling the switching valve 24.

The limit switch 23 is a switch for detecting that the test head 100 is positioned at the lowermost limit. This limit switch 23 is provided, as shown in FIG. 3, for example, on a side surface of the upright member 13 with such height that a part of one elevating arm 15 contacts with the limit switch 23 when the elevating arms 15 moves downwards the test head 100 to the lowermost limit.

This limit switch 23 is connected to the sub pipe 26, as shown in FIG. 4. When the limit switch 23 is turned off (the test head 100 is positioned at any height other than the lowermost limit), the valve thereof is closed so as to shut the sub pipe 26. On the other hand, when the limit switch 23 is turned on (the test head 100 is positioned at the lowermost limit), the valve thereof is opened so as to supply the switching valve 24 with pressurized air via the sub pipe 26. The switching valve 24 is switched by supply of this pressurized air.

The switching valve 24, which is connected to the main pipe 25, is capable of switching supply destination between a first port 42 and a second port 43 of air cylinder 40 employed in each stopper 30 in response to ON/OFF of the limit switch 23. By such switching operation, the air cylinder 40 of each stopper 30 moves up and down.

As shown in FIG. 5, each stopper 30 comprises a mounting plate 31, holders 32, the air cylinder 40, a guide unit 33, and a pressing unit 50.

The air cylinder 40 according to the present embodiment is, as shown in FIG. 4, a biased-cylinder having a spring 42 which biases a piston 41 downward. This air cylinder 40 is a cylinder having a lock mechanism which can lock (hold) a rod 43 in response to a shutoff of the air supplying. Consequently, even though the air supply is shut off, the air cylinder 40 according to the present embodiment can forcibly move downward the rod 43 by means of spring 42 and can lock the rod 43 in the status where the rod 43 have been moved downward, thereby to prevent the test head moving apparatus 10 from being moved without discretion at the time of a shutoff of the air supplying.

This air cylinder 40 comprises two ports 44 and 45, as shown in FIG. 4 and FIG. 5. Supplying the first port 44 with pressurized air causes the rod 43 to move downward. On the other hand, supplying the second port 45 with pressurized air causes the rod 43 to move upward.

As shown in FIG. 4, when the limit switch 23 is turned off, then the first port 44 is supplied with pressurized air from the air supplying source 21 via the switching valve 24. On the other hand, when the limit switch 23 is turned on, then the switching valve 24 switches the supply destination of pressurized air from the first port 44 to the second port 45.

This air cylinder 40 is fixed to the mounting plate 31 via two holders 32, as shown in FIG. 5. This mounting plate 31 is fixed to each base member 12 of the frame 11, as will be described later. The rod 43 of air cylinder 40 penetrates the guide unit 33, and the pressing unit 50 is attached to the end of rod 43. The rod 43 is smoothly guided by bearings of the guide unit 33 at the time of driving the air cylinder 40.

The pressing unit 50 comprises a base plate 51, springs 52, an abutting plate 53, bolts 54, and a cushion 55, as shown in FIG. 5.

The base plate 51 is configured of a disk-like member in the present embodiment, and the end of rod 43 of air cylinder 40 is fixed to the upper surface center thereof. Moreover, three through-holes 51a which bolts 54 penetrate are formed on the base plate 51. These three through-holes 51a are arranged substantially equally spaced.

Also the abutting plate 53 is configured of a disk-like member in the present embodiment. The abutting plate 53 has three screw holes 53a formed to be screwed with the bolts 54. These three screw holes 53a respectively face through-holes 51a of the base plate 51.

In addition, the cushion 55 is applied to the lower surface of abutting plate 53. This cushion 55 is made of a deformable and anti-slip material, such as rubber, so that the pressing unit 50 closely contacts with a floor plane.

Three springs 52 are interposed between the base plate 51 and abutting plate 53. Each spring 52, which is arranged coaxially with each bolt 54, provides a biasing force in the direction to put distance between the base plate 51 and abutting plate 53.

In the status where the springs 52 are interposed between two plates 51 and 53, the bolts 54 are inserted from the top surface of base plate 51 into respective through-holes 51a, these bolts 54 are screwed into respective screw holes 53a of the abutting plate 53, and heads of bolts 54 are engaged with the top surface of base plate 51. Thus, the bolts 54 restrict the plates 51 and 53 from putting larger distance therebetween.

Note that the planar shape of each plate 51, 53 is not limited to circular shape, and may alternatively be rectangular shape. Also note that the number of springs 52 is not limited, and may be arbitrarily set depending on the elastic force required.

These four stoppers 30 as described above are, as shown in FIG. 2 and FIG. 3, provided in the vicinity of respective front ends and back ends of two base members 12. When the interlock mechanism 20 operates, the pressing units 50 of stoppers 30 press the floor plane so as to prohibit the test head moving apparatus 10 from moving horizontally. On the other hand, when the interlock mechanism 20 is released, the pressing units 50 of stoppers 30 move away from the floor plane so as to allow the test head moving apparatus 10 to move horizontally.

Figure 6A:
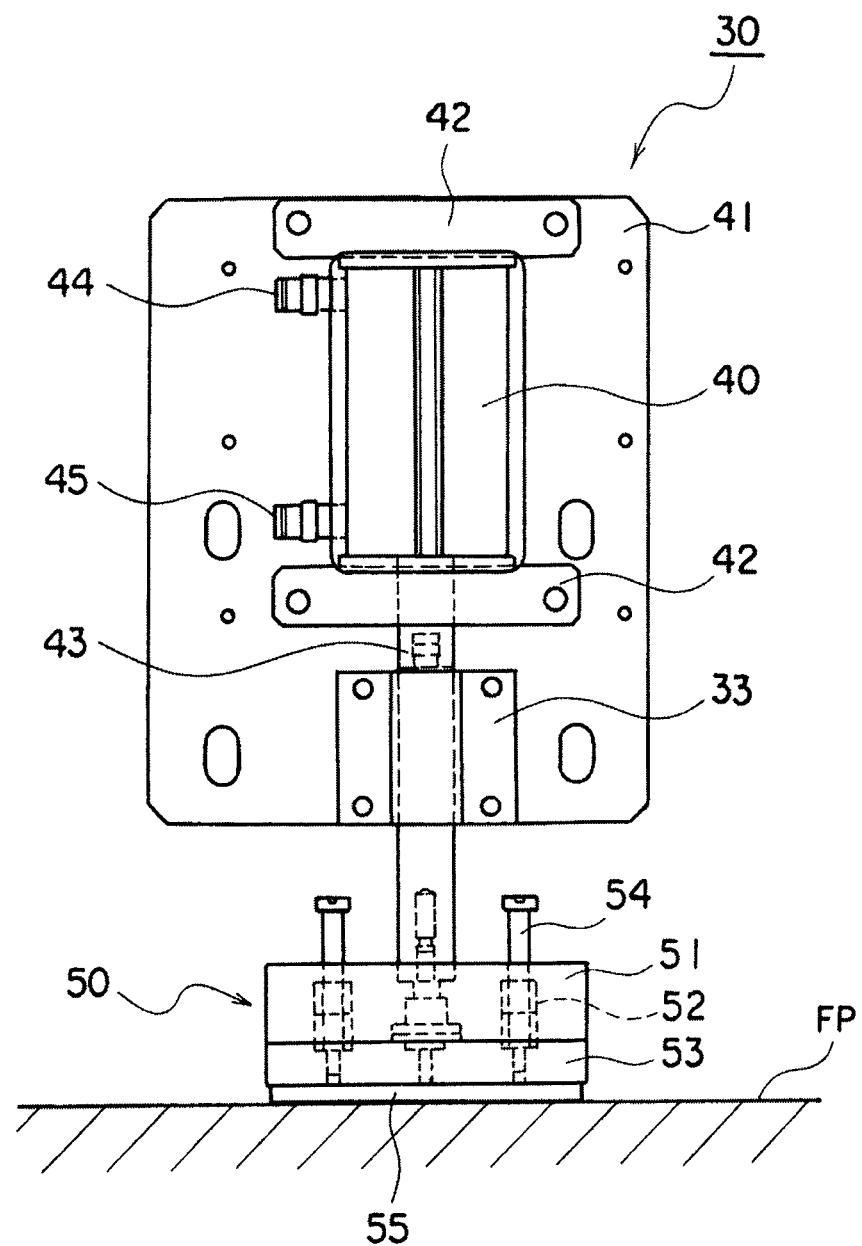
FIG. 6A is a side view illustrating the stopper when the test head is positioned at any height.
Figure 6B:
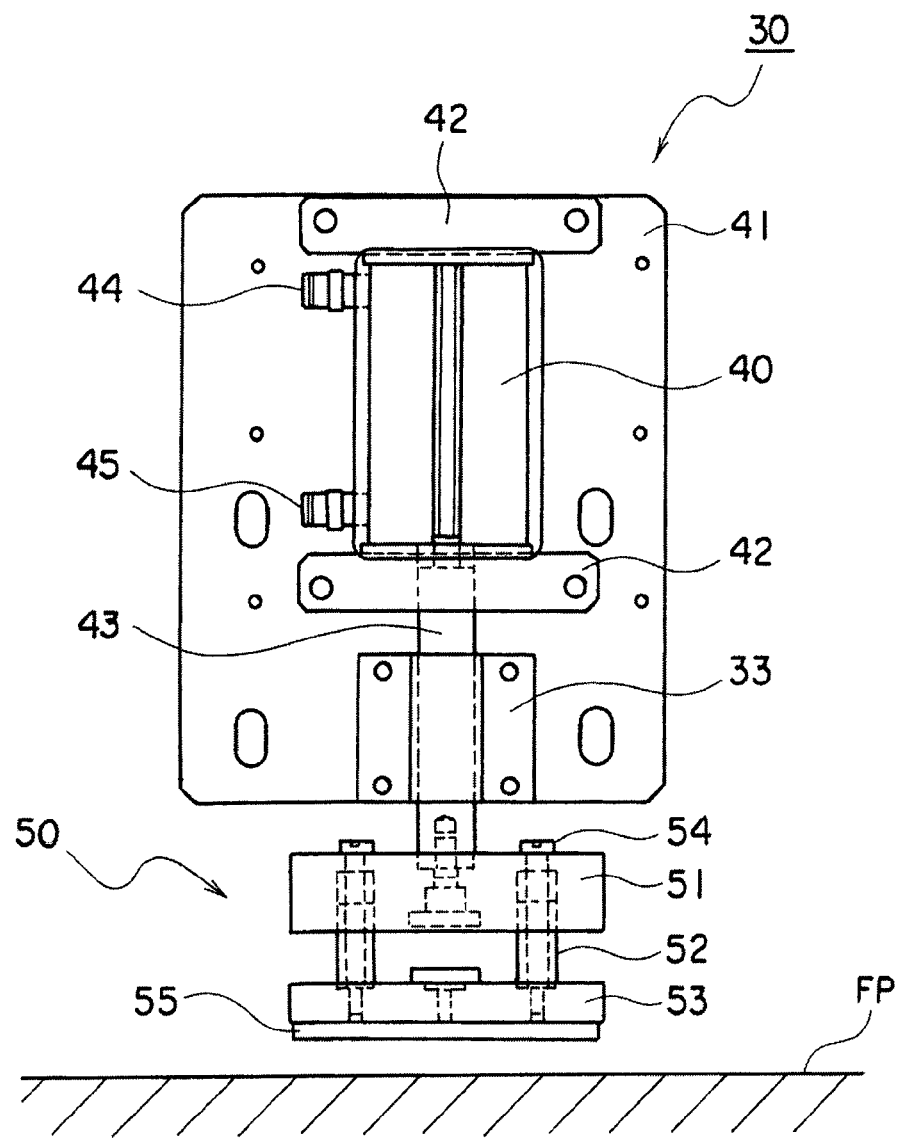
FIG. 6B is a side view illustrating the stopper when the test head is positioned at the lowermost limit.
Figure 6C:
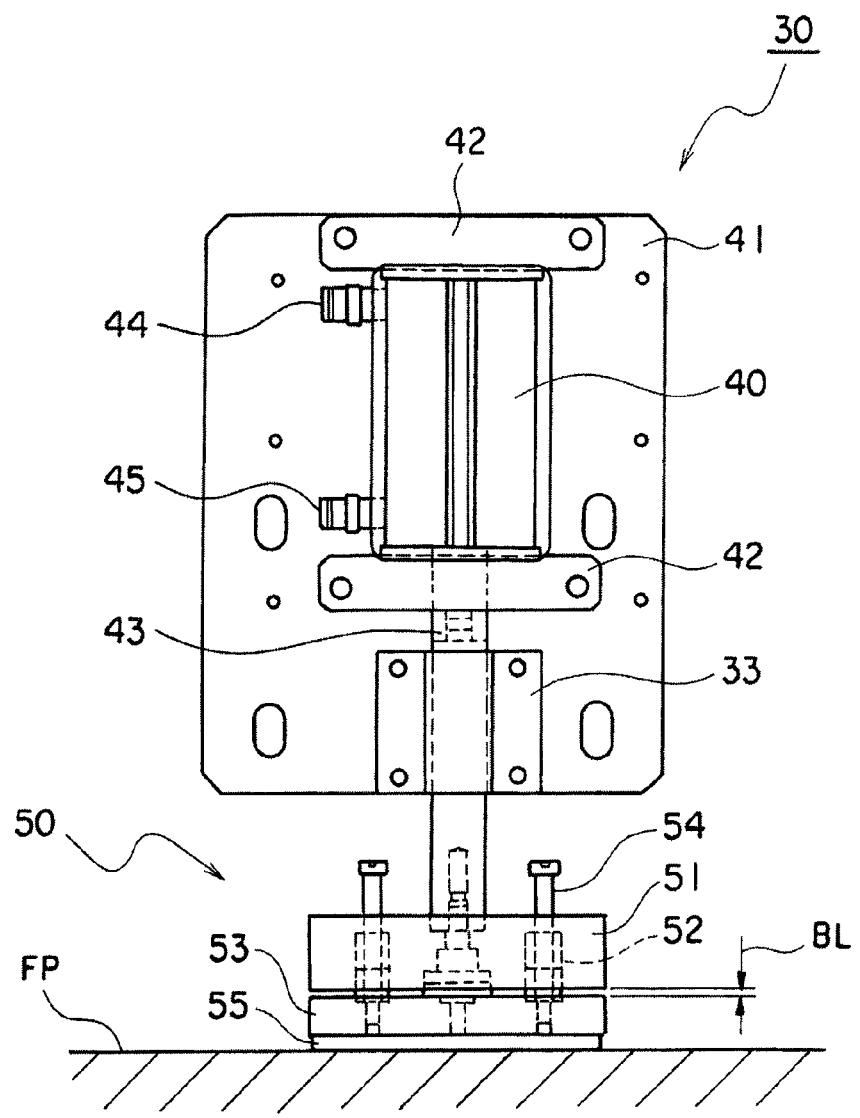
FIG. 6C is a side view illustrating the stopper when an air supply is shut off.

FIG. 6A is a side view illustrating the stopper when the test head is positioned at any height other than the lowermost limit, FIG. 6B is a side view illustrating the stopper when the test head is positioned at the lowermost limit, and FIG. 6C is a side view illustrating the stopper when the air supply is shut off.

Referring FIG. 6A to FIG. 6C, the operation of test head moving apparatus 10 according to the present embodiment will be hereinafter described.

In the case where the test head 100 is positioned at any height other than the lowermost limit during the joining operation of test head 100, the limit switch 23 is turned off. In this case, the pressurized air supplied from air supplying source 21 is provided to the first ports 44 of air cylinders 40 via the switching valve 24. Thereby the air cylinders 40 moves the pressing units 50 downwards, the pressing units 50 are pressed onto floor plane FP, as shown in FIG. 6A, and the horizontal movement of the test head moving apparatus 10 is prohibited. As a consequence, the present embodiment enables to prevent the interference between the test head 100 and handler 300 during the joining operation thereof.

Actually in the present embodiment, the regulator 22 set the pressurized air low (approximately 0.5 MPa, for example), and the air cylinders 40 merely output weak force of such an extent as to cause the springs 52 of pressing units 50 to be constricted. For this reason, even if the stoppers 30 press their pressing units onto floor plane FP, it is possible to maintain the levelness of the test head 100 with respect to the handler 300 which has been set with high accuracy.

When an operator handles the first operating handle 132, the elevating arms 15 move downwards and the test head 100 positions at the lowermost limit, then the limit switch 23 turns on. Thereby the pressurized air provides to the second ports 45 of air cylinders 40 via the switching valve 24, and as a consequence the air cylinders 40 move the pressing units 50 upwards. For this reason, the pressing units 50 move away from the floor plane FP as shown in FIG. 6B, and the test head moving apparatus 10 is enabled move horizontally.

In this situation, the operator horizontally moves the test head moving apparatus 10 using the pulls 134 so that the test head 100 is positioned below the opening 310 of handler 300. After positioning the test head 100 below the opening 310, the operator moves upwards the elevating arms 15 using the first operating handle 132 so as to insert the upper portion of test head 100 into the opening 310 of handler 300. The above sequence of operations allows the test head 100 to be joined to the handler 300.

On the other hand, when the supply of pressurized air is shut off, as shown in FIG. 6C, the spring 42 pushes down the piston 41 so as to extend the rod 43, and the lock mechanism locks the rod 43 in the status where the pressing units 50 press onto floor plane FP. Consequently, it is possible to prevent the test head moving apparatus 10 from moving without discretion at the time the air supply is shut off.

Moreover, in the present embodiment, springs 52 of the pressing unit 50 interpose between two plates 51 and 53 so as to bias the abutting plate 53 downwards. For this reason, even if the lock mechanism of air cylinder 40 has a backlash BL as shown in FIG. 6C, it is possible to absorb the backlash BL by the pressing unit 50 so as to ensure that the horizontal movement of the test head moving apparatus 10 is prohibited.

It is to be noted that the embodiments as explained above are described to facilitate understanding of the present invention and are not described to limit the present invention. Therefore, it is intended that the elements disclosed in the above embodiments include all substitutions, modifications, equivalents and the like to fall within the technical scope of the present invention.

Although it is explained that the interlock mechanism is released when the test head is positioned at the lowermost limit in the above embodiment, the present invention is not particularly limited to this. For example, the interlock mechanism may operate when the position of the test head is higher than a predetermined height. Alternatively, the height of the test head supported by the elevating arms may be measured and the interlock mechanism may operate or be released when the measured value is within predetermined respective ranges.

Furthermore, although it is explained that the interlock mechanism is driven by air pressure in the above embodiment, the present invention is not particularly limited to this. Alternatively, the interlock mechanism may be driven using other fluid pressures such as oil pressure.

What is claimed is:

1. An electronic component testing apparatus configured to test an electronic component under test, the electronic component testing apparatus comprising:
    a test head that has a socket mounted on an upper portion of the test head;
    an electronic component handling apparatus that presses the electronic component to the socket; and
    a test head moving apparatus that moves the test head in order to join the test head to the electronic component handling apparatus, wherein
    the electronic component handling apparatus includes:
        a space that is formed in a bottom portion of the electronic component handling apparatus, the space being open to a lateral side of the electronic component handling apparatus and configured to accommodate the test head; and
        an opening portion that is open to an upper portion of the space and configured to receive the upper portion of the test head when the upper portion of the test head is inserted into the opening portion,
    the test head moving apparatus includes:
        an elevating device that moves the test head up and down;
        a horizontally moving device that moves the test head in a horizontal direction; and
        a prohibiting device that prohibits a horizontal movement of the horizontally moving device on the basis of a height of the test head,
    the prohibiting device includes:
        a detecting device that detects that the test head is positioned at a predetermined height when the horizontally moving device moves the test head to insert the test head into the space; and
        a stopper that permits or prohibits the horizontal movement of the horizontally moving device when the detecting device detects that the test head is positioned at the predetermined height and that prohibits or permits the horizontal movement of the horizontally moving device when the detecting device fails to detect that the test head is positioned at the predetermined height.

2. The electronic component testing apparatus as set forth in claim 1, wherein
    the predetermined height is a lowermost limit within a range where the elevating device is capable of moving the test head up and down; and
    the stopper permits the horizontal movement of the horizontally moving device when the detecting device detects that the test head is positioned at the lowermost limit, and the stopper prohibits the horizontal movement of the horizontally moving device when the detecting device fails to detect that the test head is positioned at the lowermost limit.

3. The electronic component testing apparatus as set forth in claim 1, wherein the prohibiting device further includes:
    an abutting member that abuts against a floor plane;
    a moving device that moves the abutting member toward or away from the floor plane; and
    a first biasing device that is positioned between the abutting member and the moving device and biases the abutting member toward the floor plane.

4. The electronic component testing apparatus as set forth in claim 3, wherein:
    the moving device includes:
    a rod to which the abutting member is attached via the first biasing device; and
    a fluid pressure cylinder that moves the rod: and
    the fluid pressure cylinder is a cylinder having a lock function capable of locking the rod in response to a shutoff of supply of pressurized fluid.

5. The electronic component testing apparatus as set forth in claim 4, wherein the fluid pressure cylinder has a second biasing device that biases a piston connected to one end of the rod toward the floor plane.

6. The electronic component testing apparatus as set forth in claim 1, the electronic component testing apparatus further comprising:
    a tester electrically connected to the test head.

* * * * *